US008705757B1

(12) United States Patent
Betbeder

(10) Patent No.: US 8,705,757 B1
(45) Date of Patent: Apr. 22, 2014

(54) COMPUTATIONALLY EFFICIENT MULTI-RESONATOR REVERBERATION

(75) Inventor: Laurent M. Betbeder, Oakland, CA (US)

(73) Assignee: Sony Computer Entertainment America, Inc., Foster City, CA (US)

(*) Notice: Subject to any disclaimer, the term of this patent is extended or adjusted under 35 U.S.C. 154(b) by 1027 days.

(21) Appl. No.: 11/710,089

(22) Filed: Feb. 23, 2007

(51) Int. Cl.
*H03G 3/00* (2006.01)

(52) U.S. Cl.
USPC ................................ 381/63; 381/119; 381/97

(58) Field of Classification Search
USPC ........... 381/1, 2, 5, 10, 19, 20, 22, 28, 97, 98, 381/99, 102, 103, 108, 61, 63, 62, 300, 303, 381/59, 77, 78, 80, 82, 83, 86, 89, 332, 100, 381/101, 119, 120, 121
See application file for complete search history.

(56) References Cited

U.S. PATENT DOCUMENTS 5,491,754 A * 2/1996 Jot et al. .......................... 381/63
6,078,669 A * 6/2000 Maher ............................. 381/17
7,099,482 B1 * 8/2006 Jot et al. .......................... 381/61

* cited by examiner

*Primary Examiner* — Vivian Chin
*Assistant Examiner* — Leshui Zhang
(74) *Attorney, Agent, or Firm* — Blakely, Sokoloff, Taylor & Zafman LLP

(57) ABSTRACT

A signal processor to produce a simulated reverberation effect based on an input signal and conveying the impression of multiple interconnected resonating spaces. A feedback delay network produces a reverberation tail signal, which is delayed by varying amounts in a delay module. A panning module produces a multi-channel signal based on the reverberation tail signal and its echoes.

19 Claims, 10 Drawing Sheets

COMPUTATIONALLY EFFICIENT MULTI-RESONATOR REVERBERATION

FIELD

The invention relates to signal processing. More specifically, the invention relates to techniques for synthesizing complex reverberation effects with limited computing resources.

BACKGROUND

Humans detect and process information arriving through a number of different channels. After light signals (vision), sound and hearing may contribute most heavily to one's perception of one's environment. The human auditory system is remarkably discriminating, and though it often fares poorly in comparisons with lower animals, people can detect subtle cues in an audio signal and use them to make inferences about their surroundings, even when those surroundings cannot be seen. The detection and inference occur largely subconsciously, so a carefully-prepared audio program can provide an extremely compelling and visceral experience for a listener.

Virtual reality and game applications can be greatly enhanced by an accurate audio rendering of a simulated environment. Unfortunately, producing a high-resolution, multichannel audio stream that models the interaction of sounds from various sources with surfaces, spaces and objects in the simulated environment can be at least as computationally expensive as producing a sequence of high-resolution visual images of the same environment. For example, FIG. 2 shows a plan view of a simple, two-room environment, with a sound source 210 in one room 220 and a listener 230 in the other room 240. Like an optical ray tracer for rendering photorealistic visual images, an "audio renderer" could compute the aggregate sound signal arriving at listener 230 by following sound or compression waves 250, 260, 270 emanating from the source 210, reflecting off walls and objects, and eventually arriving at the listener 230. Since the speed of sound is low compared to the speed of light, an audio-realistic rendition must account for propagation delays along various paths. These delays are perceived as phase differences and echoes, or more generally, reverberations.

One can easily imagine that the computational burden of producing a continuous high-quality stream of audio signals would overwhelm contemporary processing capabilities. Samples at a rate of 44.1 KHz or 48 KHz, for multiple channels, based on many audio sources at different locations relative to the listener, and within a complex and dynamic environment, translate to enormous volumes of data. Moreover, a sound produced at a first time may echo, reverberate and linger to affect the audio scene for several seconds. Less computationally-expensive approaches are essential for real-time simulations.

FIG. 3 shows a signal-processing network that can produce an adequate audio simulation for some environments, with only a fraction of the processing required for a full audio-realistic rendering. An input signal 110 enters the network, and a portion is passed directly through as "dry" signal 340. Several delayed versions of the signal 365, produced by delay lines of varying lengths (not shown) or by different "taps" on a single delay line 360, simulate discrete echoes produced when the input signal reflects off a wall or object and travels to the listener. Finally, feedback-delay network ("FDN") 350 receives the delayed input signal and produces a diffuse, exponentially-decaying reverberation "tail" signal that resembles the indistinct, colored noise a listener perceives after the sound and its primary, distinct echoes have died away. The discrete echo signals 365 may be attenuated by amplifier/attenuators 370 and/or filtered by filters 380 to simulate different atmospheric conditions and reflective surfaces. The FDN output or the dry signal may also have their amplitude or spectral distribution adjusted. Finally, the dry signal, FDN output, and discrete echo signals are combined and distributed through a panning module 390 to prepare them for distribution and replay through a multi-channel speaker system.

The network shown in FIG. 3 produces a reasonable simulation of echoes and reverberations in simple, closed environments, but its effect is unconvincing for more complex audio environments with large, interconnected and/or unbounded resonating cavities. Techniques for efficiently producing convincing multi-channel audio reverberation effects in complicated environments may be of value.

BRIEF DESCRIPTION OF DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

DETAILED DESCRIPTION

Signal processors according to an embodiment of the invention alter the traditional flow of signals through a reverberation simulation network. Reverberation tail signals are produced from the dry signal or from earlier discrete echoes, and discrete echoes of the tail signals are incorporated into the final audio simulation. Some embodiments can be easily reconfigured to produce prior-art signals or the inventive synthetic reverberations.

Figure 1:
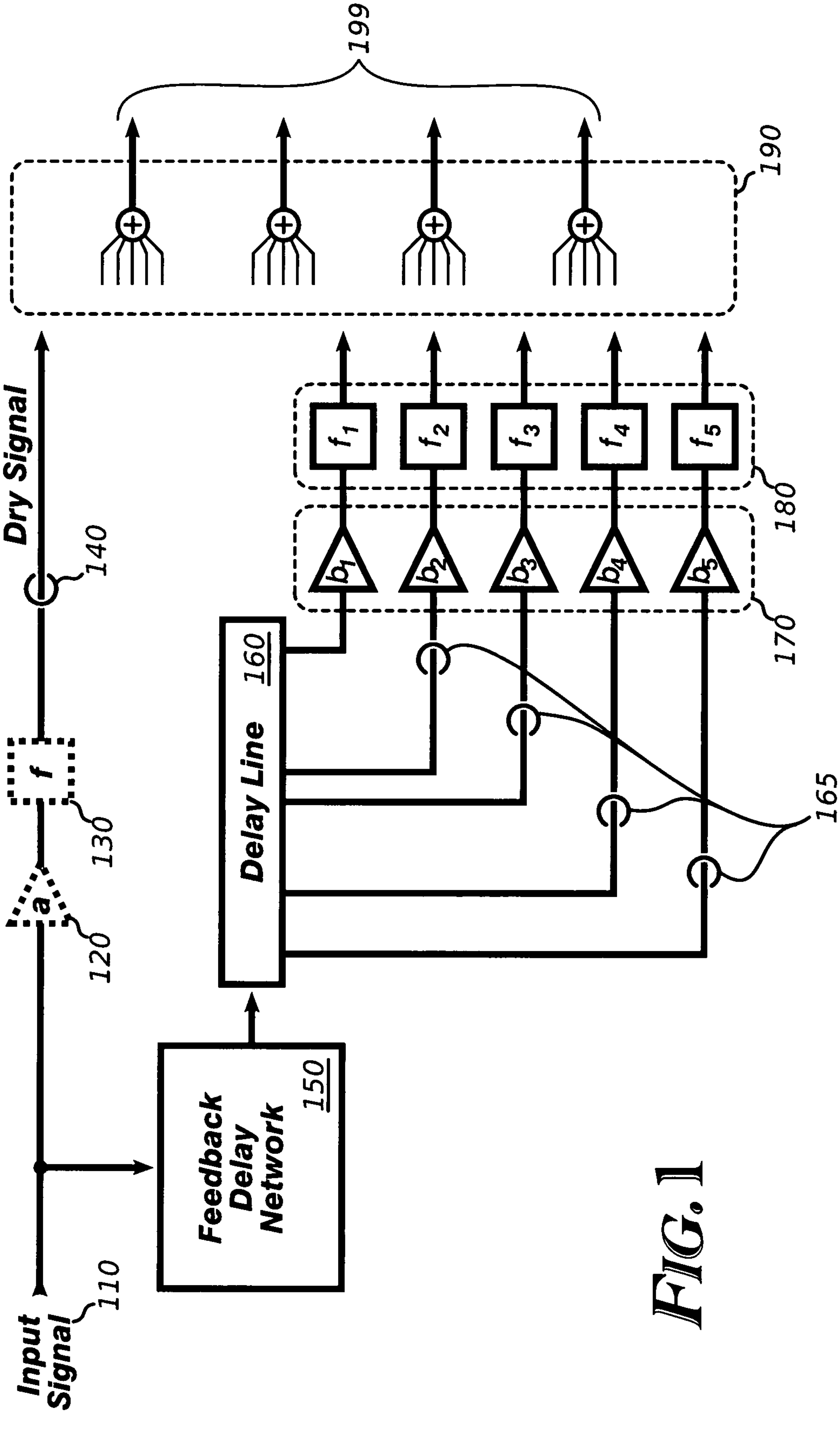
FIG. 1 shows elements of an embodiment of the invention.
Figure 2:
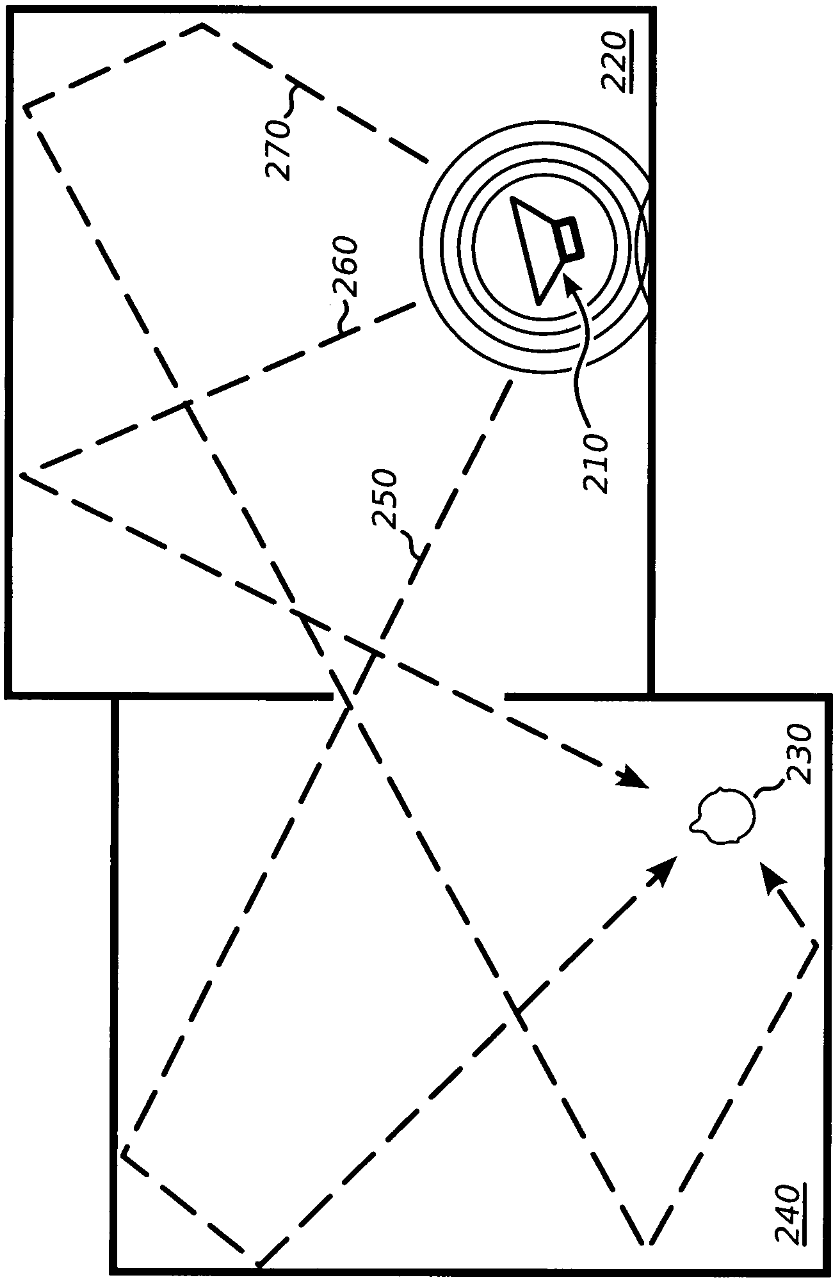
FIG. 2 shows a precise, but computationally expensive, method of producing an audio signal containing simulated reverberations.

FIG. 1 shows a signal processing network according to an embodiment of the invention. Input signal 110 may have its level adjusted (increased or decreased) by an amplifier/attenuator 120 and/or its spectrum adjusted by filter 130, but is otherwise passed through as "dry" signal 140. In some embodiments, any level adjustment and filtering of the input signal may occur before the signal enters the network. Input signal 110 also enters feedback-delay network ("FDN") 150. FDN 150 produces an exponentially-decaying reverberation tail signal which is supplied as input to delay line 160. Variously-delayed versions of the tail signal 165 are obtained from taps on the delay line (or, equivalently, from a plurality of individual delay lines of various lengths) and, after optional level adjustment by amplifier/attenuators 170 and/or filtering by filters 180, are mixed and distributed in a panning module 190 to produce a plurality of signal channels 199. These signal channels may subsequently be combined into a single encoded signal for reproduction on a multi-channel audio system.

Figure 3:
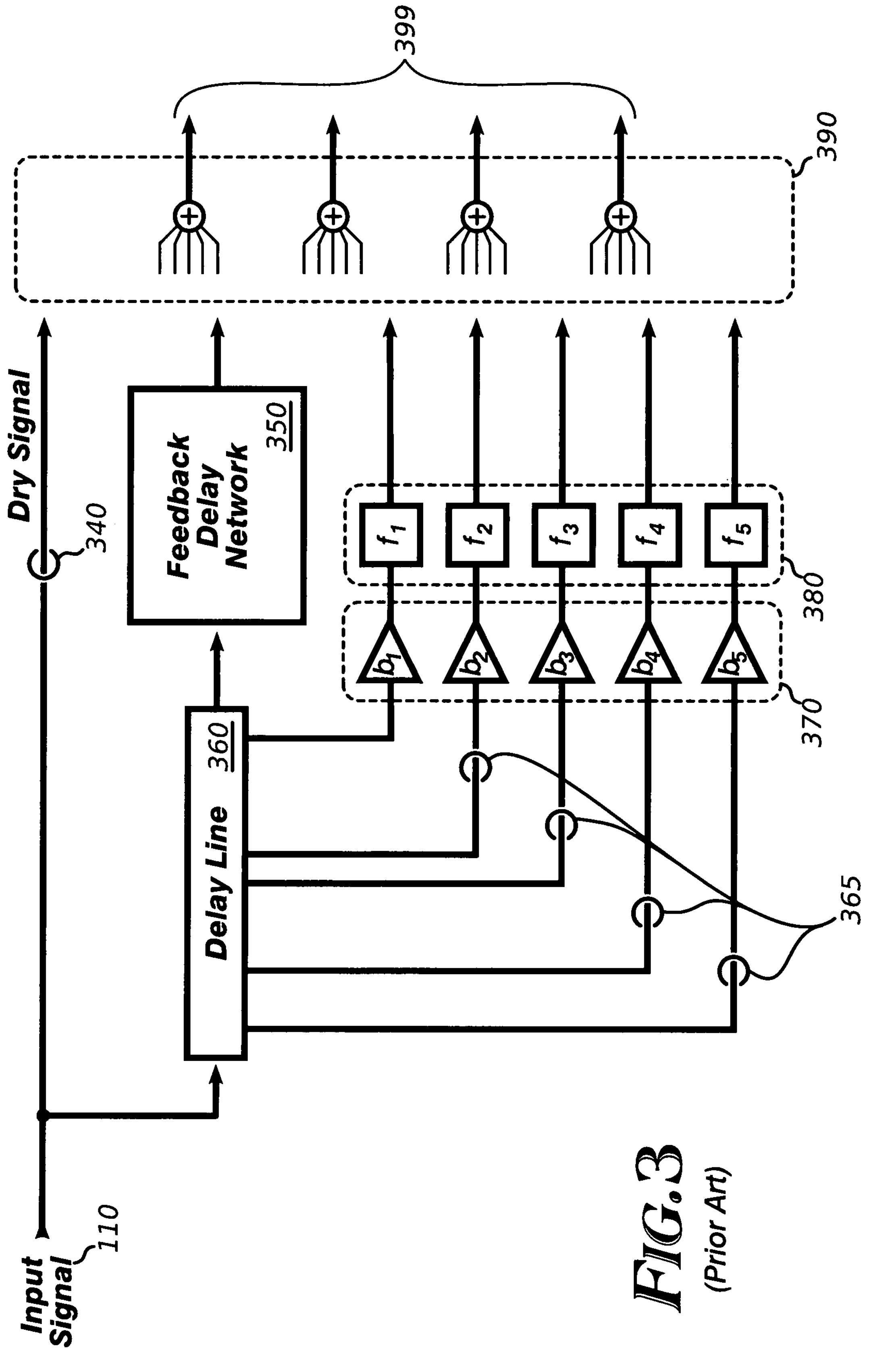
FIG. 3 (Prior Art)
FIG. 3 shows a prior-art signal processing network to produce simulated reverberations.
Figure 4A:
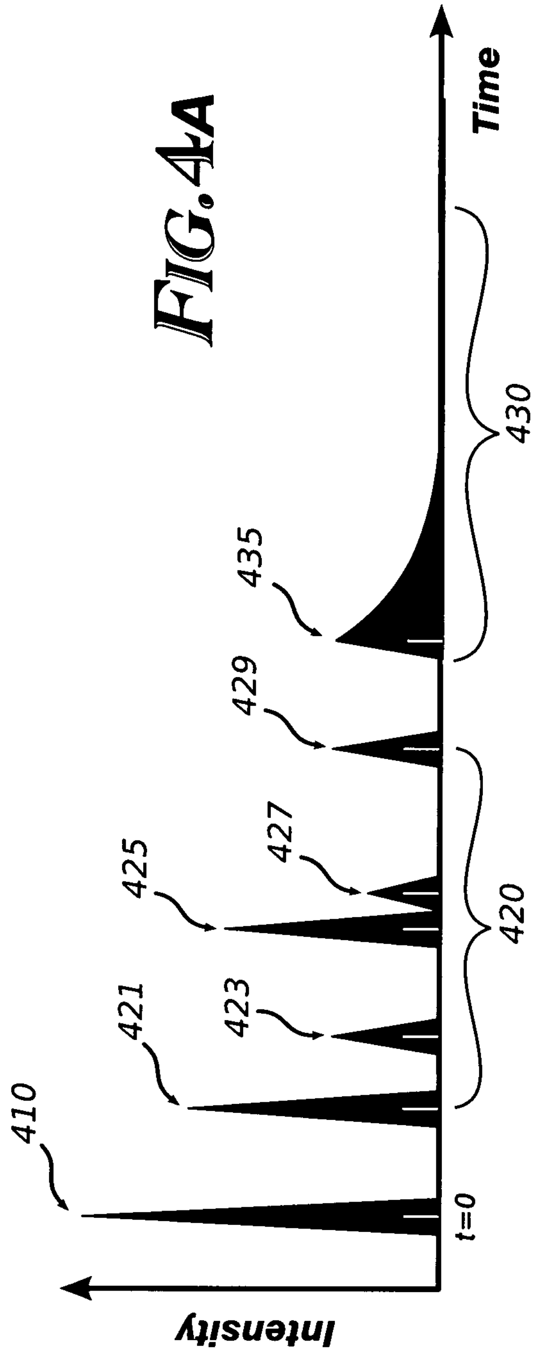
FIG. 4A is a time/intensity plot showing a simulated reverberation produced by a prior-art signal processing network.
Figure 4B:
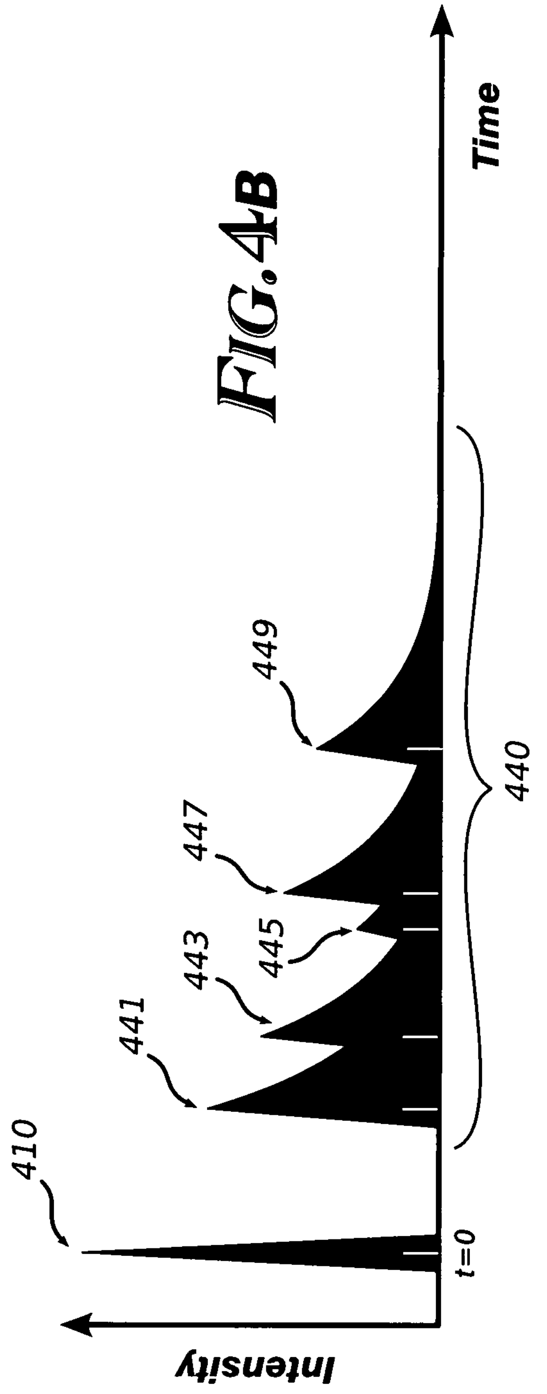
FIG. 4B is a time/intensity plot showing a simulated reverberation produced by an embodiment of the invention.

FIG. 4A shows how a prior-art reverberation simulation network such as that shown in FIG. 3 responds to an input sound or "slap:" after the initial sound 410, discrete echoes 421-429 are emitted at varying temporal delays during time period 420. Finally, FDN 350 produces trailing tail reverberation 435 during time period 430. In contrast, FIG. 4B shows how the inventive audio network responds to a slap: after the initial sound 410, a first "tail" reverberation 441 is produced. This tail reverberation enters the delay line 160 and echoes of the reverberation tail 443-449 are produced during time period 440.

The repeated tail reverberation echoes produce an auditory effect similar to that of a sound communicated to the listener through two or more large, interconnected and/or open resonators, in contrast to the discrete echoes of the prior art network, which suggest smaller, distinct spaces. Mostly-closed resonators such as parking structures, warehouses and caves, as well as open or unbounded spaces such as streets, mountains and valleys, and combinations of various resonators, can be simulated.

Figure 5:
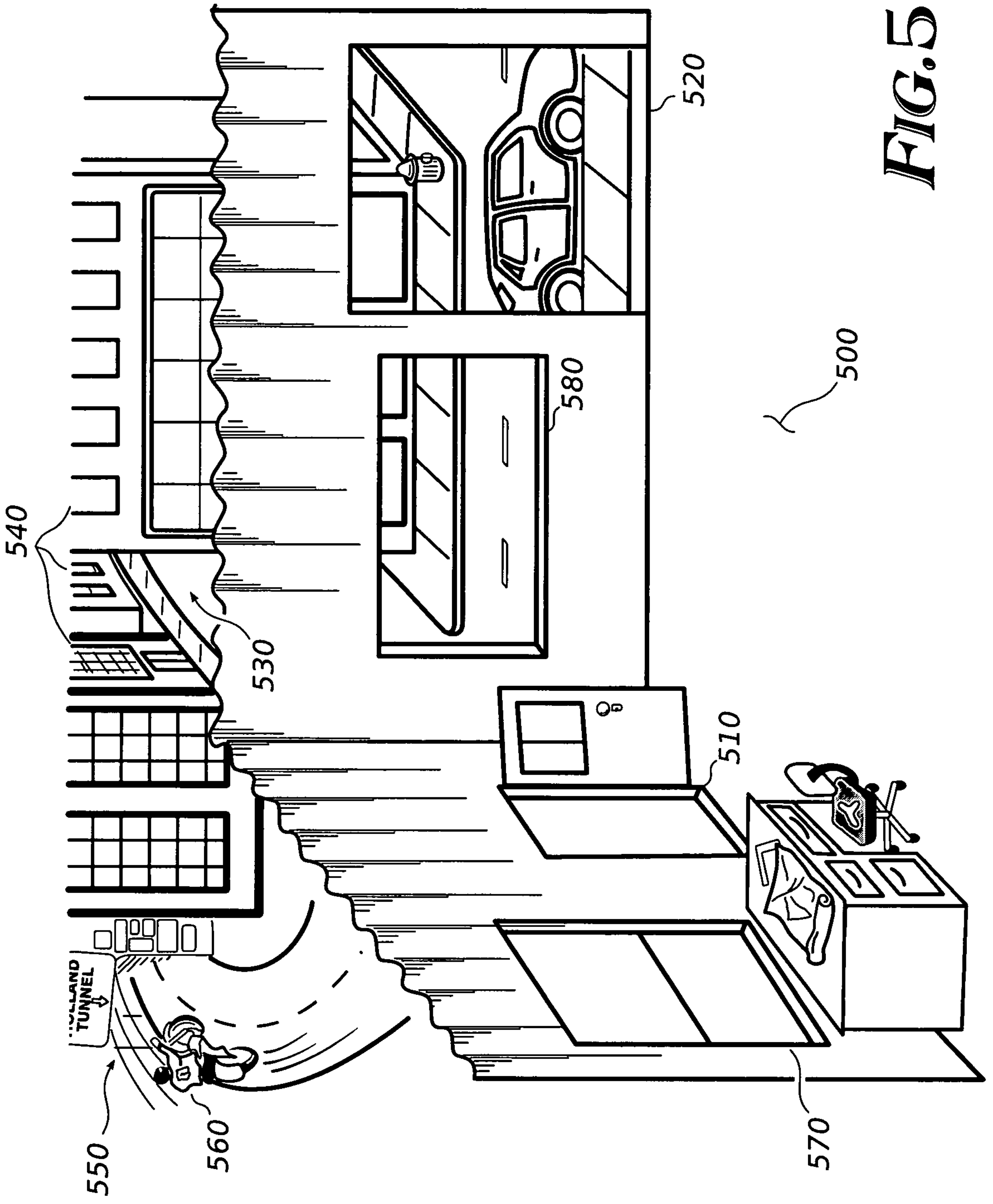
FIG. 5 is a visual depiction of a scene, rendered from a listener's viewpoint, that shows (simulated) features that affect the audio prepared for the listener.

FIG. 5 shows an example environment for which an embodiment of the invention produces a superior simulated reverberation, depicted from the viewpoint of a listener. The immediate environment is a corrugated-metal warehouse 500 with sparse furnishings, forming a first resonator. Visible through the open doors 510, 520 of the warehouse is a street 530 lined with tall buildings 540. This forms a second, partially-open, "outdoor" resonator. A third resonator is formed by a tunnel 550. An embodiment of the invention can simulate the sound reaching the listener after passing through some or all of these resonators. For example, consider a motorcycle 560 traveling through tunnel 550. Certain frequencies of its exhaust note may be amplified by the tunnel; in addition, Doppler effects may alter the sounds emerging from either end of the tunnel. (The selective amplification can be simulated by filters 180, while Doppler effects may be added by splitting the input sound source in two, shifting the frequencies, and processing the two sources in parallel.)

After leaving the tunnel 550, the sound(s) may travel through the building-lined street 530, which produces further discrete and diffuse echoes, all of which are simulated by filtered and delayed signals from an FDN such as element 150 of FIG. 1. Finally, the sound enters the warehouse resonator 500 through doors 510 and 520, windows 570 and 580, or through the shell of the warehouse itself. These various paths can also be simulated by differently-filtered and delayed signals from the FDN. The signals are combined and associated with spatial positions by a panning module 190, and encoded for reproduction on a multi-channel speaker array.

Figure 6:
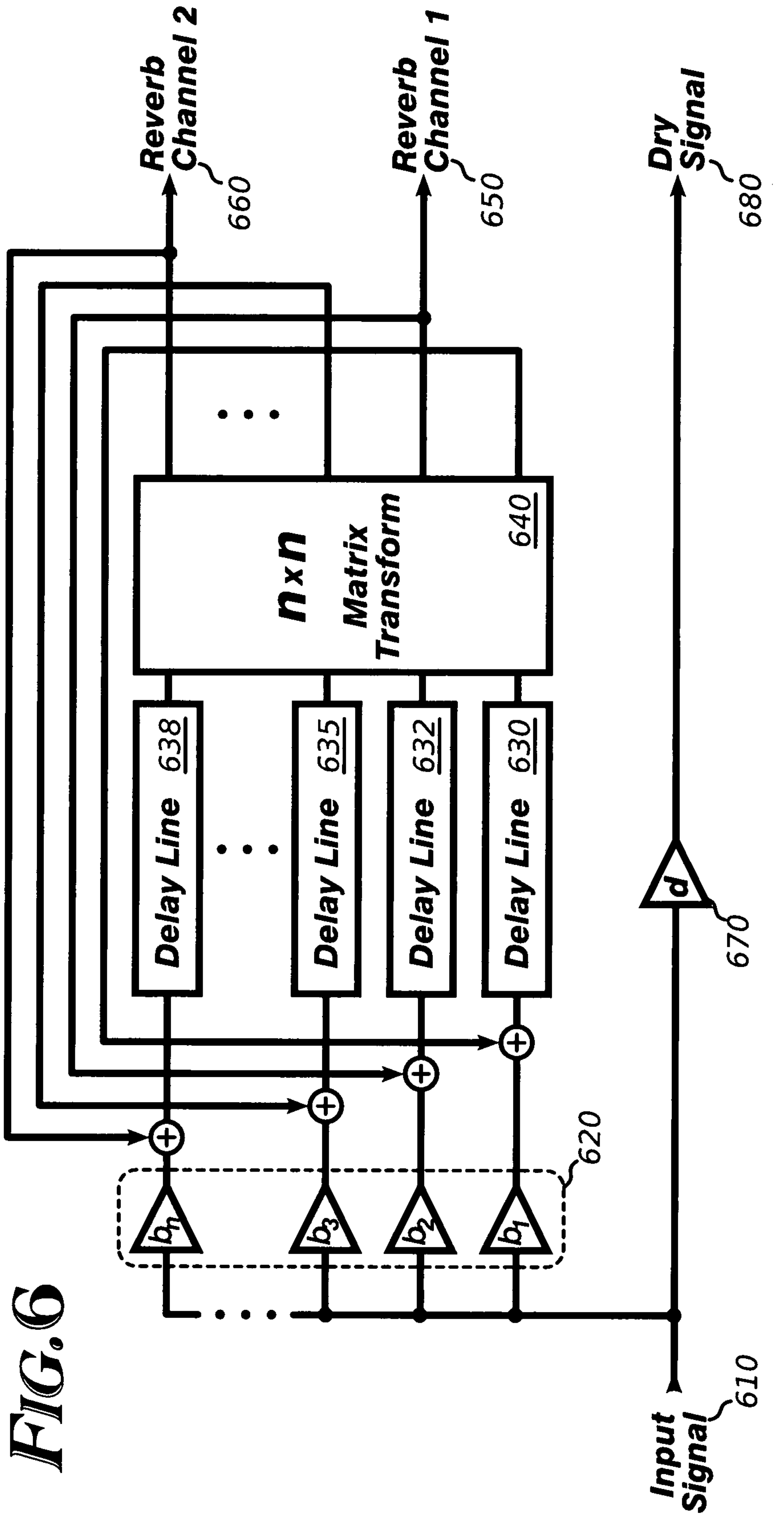
FIG. 6 shows a feedback-delay network ("FDN") that can be used with an embodiment of the invention.

The feedback-delay network ("FDN") used in an embodiment of the invention may be constructed as shown in FIG. 6. An input signal 610 enters the FDN, and a portion (possibly level-adjusted by amplifier/attenuator 670) may pass through as dry signal 680. Input signal 610 is also adjusted to various levels by amplifier/attenuators 620, and each of the n signals enters a delay line 630-638. The lengths of these delay lines should be relatively prime numbers of samples (i.e. the delays, expressed in sample times, should have no common divisors but 1). The outputs of the delay lines are treated as a vector and n×n matrix transform 640 is applied, yielding a second vector. Elements of this second vector are fed back and mixed with the scaled delay-line inputs. Some elements of the second vector are also taken from the FDN as decorrelated synthetic reverberation signals 650, 660, which correspond to input signal 610.

n×n matrix transform 640 may be, for example, a Hadamard or Fourier matrix transformation, as described in greater detail in co-pending application Ser. No. 11/710,080 by the same inventor. As therein described, not all elements of the second vector are useable as synthetic reverberation signals. In general, only about half ( $$\left(\frac{M}{2}-1, \text{ for an order } M \text{ matrix}\right)$$

for an order M matrix) of the outputs are useable. However, using M=16 gives 7 useable channels, which fits conveniently with a common "surround sound" format that uses seven primary audio channels and one low-frequency channel ("7.1-channel audio"). Furthermore, since $M=16=2^k$ for k=4, the Fast Walsh Hadamard Transform ("FWHT") may be used in place of a conventional matrix multiplication to improve computation efficiency.

Figure 7:
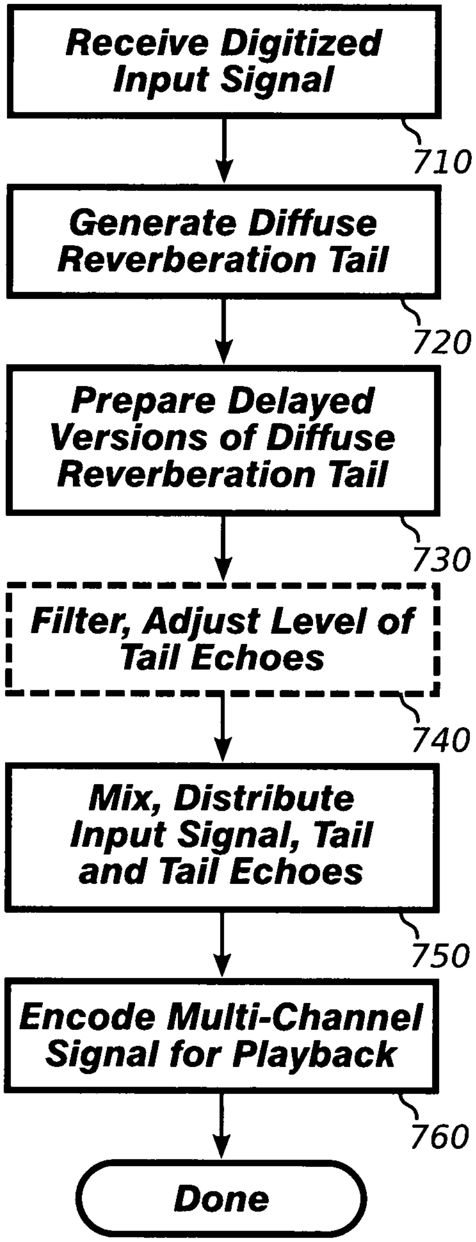
FIG. 7 outlines a method according to an embodiment of the invention.

Note that the FDN of FIG. 6 and the embodiment shown in FIG. 1 are composed of many of the same basic elements: amplifiers, filters, delay lines and mixers. The functions of these elements can be efficiently performed by a general-purpose computer or a digital signal processor ("DSP"), either of which can be programmed or otherwise configured to implement the method outlined in the flow chart of FIG. 7.

Processing begins when a digitized input signal is received (710). The signal may be entirely synthetic (e.g. produced algorithmically based on a mathematical function), or may include samples recorded from a real-world source and digitized. Live sound captured by a microphone in real time and digitized can also be processed by embodiments of the invention. Sounds may include, for example, motorcycle or car engines, gunshots, explosions, sirens, music, voices and conversation, construction and factory machinery, etc.

The input signal is processed to generate a diffuse reverberation tail (720). For example, the signal may be sent to a feedback-delay network ("FDN") like that described above, where the FDN's output is the diffuse reverberation tail signal.

Delayed versions of the diffuse reverberation tail are prepared (730), perhaps by passing the tail signal through one or more delay lines. Here, too, the delay line delays should be mutually-prime. Filters and/or attenuators may be applied to adjust the level of the tail signal and its echoes (740). Then, the input signal, tail reverberation signal, and echoes of the tail reverberation signal are mixed and distributed (750) to produce a multi-channel signal that localizes the source of the input signal as desired within a simulated environment.

Finally, the multiple signal channels are encoded for playback over a multi-speaker system (760) such as a 5.1, 7.1, or 13.2 surround-sound system.

Figure 8:
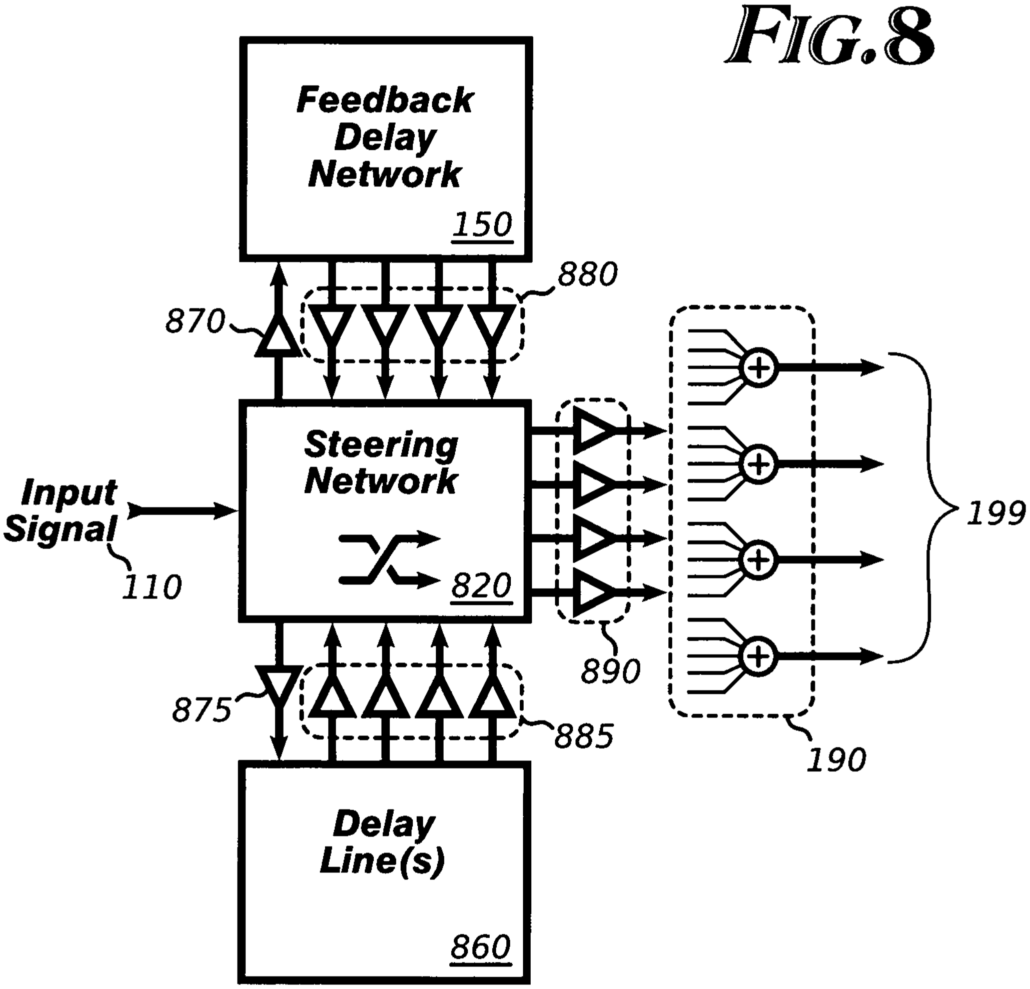
FIG. 8 shows another embodiment of the invention.

FIG. 8 shows a flexible embodiment that can be configured to operate as a prior-art reverberation synthesizer, a reverberation synthesizer according to the invention, or a hybrid combination of the two. Input signal 110 enters a steering network 820, which can send signals to processing modules such as feedback delay network 150 and delay line(s) 860. Signals sent out of steering network 820 may be amplified, attenuated and/or filtered by processing elements indicated in this Figure as 870 and 875. Processing modules 150 and 860 return one or more processed signals to steering network 820; some or all of the returned signals may also be amplified, attenuated and/or filtered by elements indicated as 880 and 885. Steering network 820 can also send an output of one processing module to the input of another processing module. For example, an output of delay line(s) 860, carrying a delayed version of input signal 110, may be sent to FDN 150; or an output of FDN 150, carrying an exponentially-decaying simulated tail reverberation signal, may be sent to delay line (s) 860. After processing through modules 150 and 860, signals may be further amplified, attenuated and/or filtered by elements 890, then processed by panning module 190 to mix and distribute the signals among a plurality of reproduction channels 199. The flexible network shown in FIG. 8 can produce a synthetic reverberation signal based on input signal 110, where discrete echoes, diffuse reverberation tail signals, and discrete echoes of the reverberation tail signals, are combined into a complex signal that simulates the audio behavior of an environment containing multiple interacting resonators.

Figure 9:
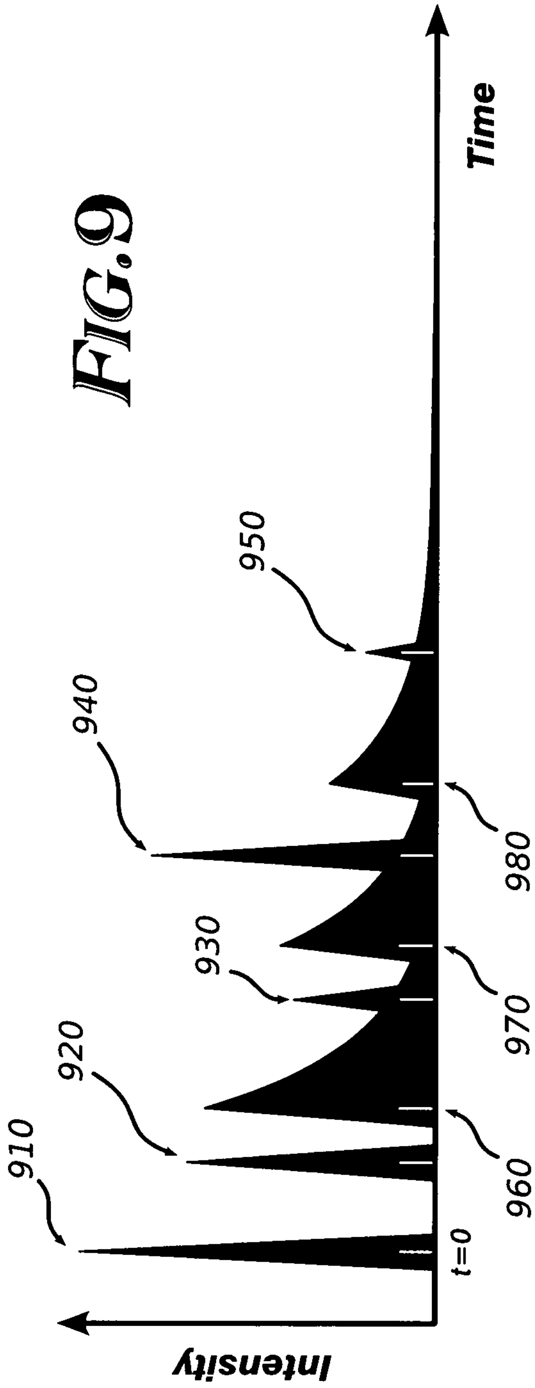
FIG. 9 is a time/intensity plot showing a response of a complex simulated auditory environment.

FIG. 9 shows the response of a complex simulated auditory environment. An initial slap 910 produces discrete echoes indicated at 920, 930, 940 and 950. These discrete echoes are interspersed with reverberation tails and echoes of reverberation tails indicated as 960, 970 and 980. Discrete echoes 920-950 convey the impression of highly reflective surfaces at various distances from the sound source and listener, while reverberation tails 960-980 suggest that the sound (or some portion of it) traveled through and was altered by a distinct resonator of a particular size, shape and auditory response. Changing the delays between echoes and the frequency response of filters associated with each echo changes the listener's conception of the environment.

Figure 10:
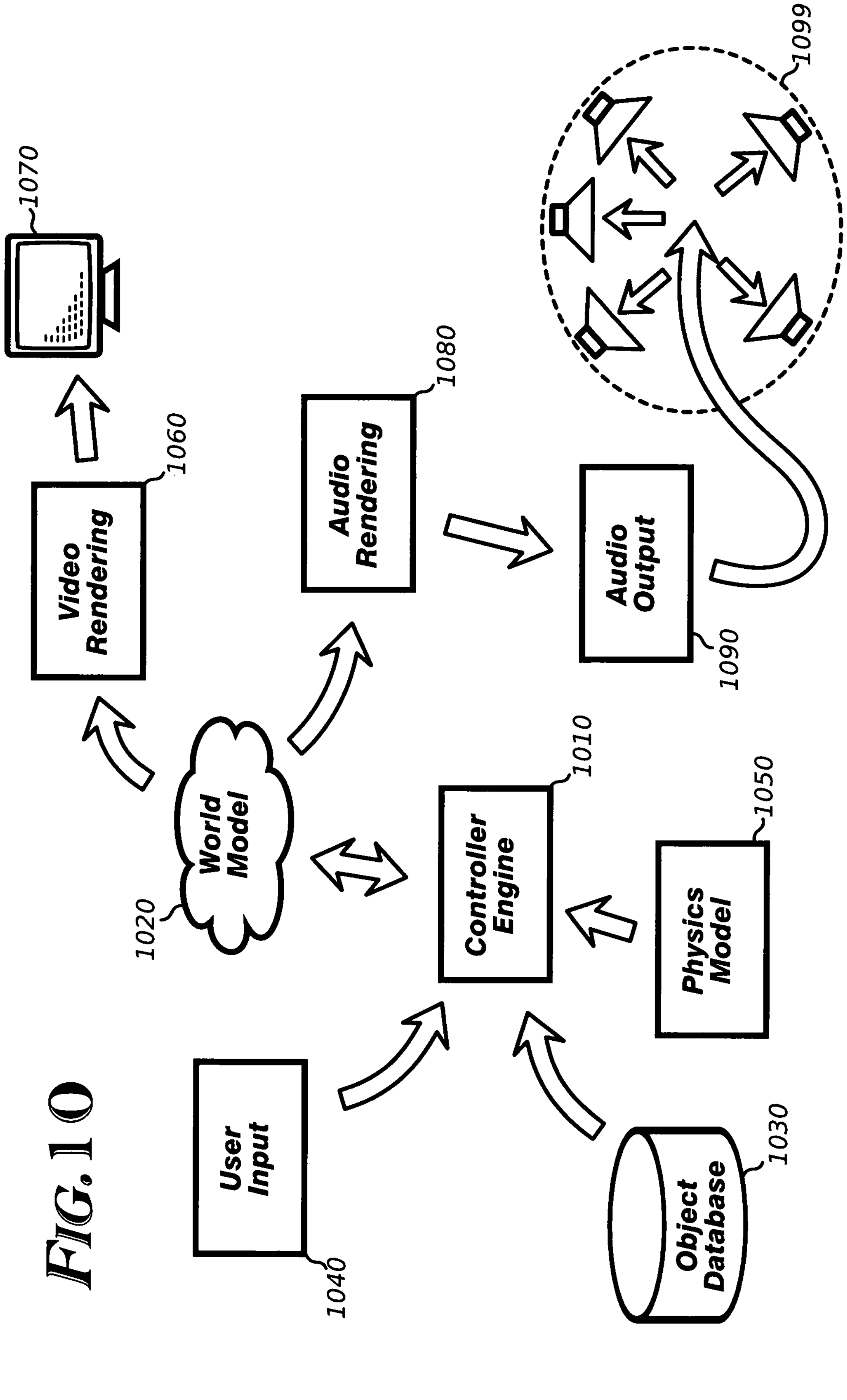
FIG. 10 is a block diagram of a system that includes an embodiment of the invention.

FIG. 10 shows some components of a system that can implement an embodiment of the invention. A controller engine 1010 uses information from many sources to construct and maintain a world model 1020. For example, information in object database 1030 may describe the size, shape, color, mass, sound and other characteristics of objects that can be instantiated in world model 1020. User input 1040 is collected via a controller such as a joystick, keypad, button array or other similar device, and the controller engine simulates the evolution of world model 1020 under the influence of user input 1040 and any applicable physics model 1050. Periodically (e.g. once every thirtieth or sixtieth of a second) video rendering subsystem 1060 creates snapshots of the world model from one or more vantage points and displays them on a monitor 1070. Of relevance to embodiments of the present invention, audio rendering subsystem 1080 computes the auditory environment that would be experienced at a particular vantage point by mixing various input sources according to their spatial locations, computing synthetic reverberation signals using the efficient multi-resonator reverberation simulator described above, panning and mixing the output channels, and perhaps encoding the channels for an audio output device 1090, which plays the channels on a multi-channel speaker system 1099. (The speaker system pictured has five primary speakers and one low-frequency emitter, not shown, so it would be a "5.1" system.)

An embodiment of the invention may be a machine-readable medium having stored thereon instructions which cause a programmable processor to perform operations as described above. Alternatively, a machine-readable medium might contain information to configure a digital signal processor ("DSP") to process one or more signals as explained. In other embodiments, the operations might be performed by specific hardware components that implement amplifiers, attenuators, filters, delay elements, and matrix transformations. Those operations might alternatively be performed by any combination of programmed computer components and custom hardware components.

A machine-readable medium may include any mechanism for storing or transmitting information in a form readable by a machine (e.g., a computer), including but not limited to Compact Disc Read-Only Memory (CD-ROM), Read-Only Memory (ROM), Random Access Memory (RAM), and Erasable Programmable Read-Only Memory (EPROM).

The applications of the present invention have been described largely by reference to specific examples and in terms of particular allocations of functionality to certain hardware and/or software components. However, those of skill in the art will recognize that multi-resonator synthetic reverberation effects can also be produced by software and hardware that distribute the functions of embodiments of this invention differently than herein described. Such variations and implementations are understood to be captured according to the following claims.

I claim:

1. A signal processor comprising:

a feedback delay network ("FDN") having an input to receive an audio signal and an output to produce an exponentially-decaying reverberation tail signal based on the audio signal;

a delay module having an input coupled to the output of the FDN to receive the exponentially-decaying reverberation tail signal and produce therefrom a plurality of variously-delayed versions of the exponentially-decaying reverberation tail signal, the plurality of variously-delayed versions of the exponentially-decaying reverberation tail signal hereinafter referred to as a plurality of reverberation tail echo signals; and a panning module having a first input coupled to receive the audio signal, a second input coupled to the FDN to receive the exponentially-decaying reverberation tail signal, and a plurality of third inputs coupled to the delay module to receive the plurality of the reverberation tail echo signals, the panning module configured to produce therefrom a plurality of signal channels, the plurality of the signal channels being subsequently combined into a single encoded signal for reproduction on a multi-channel audio system.

2. The signal processor of claim 1, further comprising:

the panning module to direct the single encoded signal to speakers in a speaker array.

3. The signal processor of claim 1, further comprising:

a filter module configured to adjust a spectral composition of at least one of the exponentially-decaying reverberation tail signal and the plurality of the reverberation tail echo signals.

4. The signal processor of claim 1 wherein the FDN produces a plurality of exponentially-decaying reverberation tail signals, at least two of the plurality of the exponentially-decaying reverberation tail signals being decorrelated, and at least one of the plurality of the exponentially-decaying reverberation tail signals being received by the delay module.

5. The signal processor of claim 1 wherein the FDN comprises:

a plurality of delay lines configured to produce a plurality of variously-delayed versions of the audio signal; and a matrix transformer configured to apply a matrix transformation to a vector including the variously-delayed versions of the audio signal and produce a plurality of decorrelated exponentially-decaying reverberation tail signals, one of the decorrelated exponentially-decaying reverberation tail signals being used as the input to the delay module, wherein a matrix of the matrix transformation is one of a Hadamard matrix and a Fourier matrix.

6. A non-transitory computer-readable medium containing instructions and data to cause a programmable processor to perform operations comprising:

generating, at a feedback delay network, a diffuse simulated reverberation signal based on an input audio signal;

preparing, at a delay module coupled to the feedback delay network, a plurality of reverberation tail echo signals comprising variously-delayed versions of the diffuse simulated reverberation signal based on the diffuse simulated reverberation signal; and encoding, in a panning module coupled to the feedback delay network and the delay module, the audio signal, the diffuse simulated reverberation signal, and the plurality of the reverberation tail echo signals into a composite signal for a multi-channel reproduction system.

7. The non-transitory computer-readable medium of claim 6, containing additional instructions and data to cause the programmable processor to perform operations comprising:

filtering the plurality of the reverberation tail echo signals.

8. The non-transitory computer-readable medium of claim 6, containing additional instructions and data to cause the programmable processor to perform operations comprising:

adjusting a level of one of the plurality of the reverberation tail echo signals based on a spatial relationship between a source of the input audio signal and a listener.

9. The non-transitory computer-readable medium of claim 6, containing additional instructions and data to cause the programmable processor to perform operations comprising:

adjusting a delay of one of the plurality of the reverberation tail echo signals based on a spatial relationship between a source of the input audio signal and a listener.

10. The non-transitory computer-readable medium of claim 6 wherein generating the diffuse simulated reverberation signal comprises:

producing a plurality of differently-delayed versions of the input audio signal;

applying a matrix transformation to the differently-delayed versions of the input audio signal; and feeding outputs of the matrix transformation back into the input audio signal; wherein one of the outputs of the matrix transformation is the diffuse simulated reverberation signal.

11. The non-transitory computer-readable medium of claim 10 wherein a matrix of the matrix transformation is one of a Hadamard matrix and a Fourier matrix.

12. A system comprising:

a simulated environment containing a plurality of resonators;

a simulated sound source located at a predetermined distance from a listener in the simulated environment; and an audio signal processor, to produce a composite signal according to an input audio signal from the simulated sound source, comprising:

a feedback delay network ("FDN") having an input to receive the input audio signal from the simulated sound source as an audio signal and an output to produce an exponentially-decaying reverberation tail signal based on the audio signal;

a delay module having an input coupled to the output of the FDN to receive the exponentially-decaying reverberation tail signal and based thereon to produce a plurality of reverberation tail echo signals comprising a plurality of variously-delayed versions of the exponentially-decaying reverberation tail signal; and a panning module having a first input coupled to receive the audio signal, a second input coupled to the FDN to receive the exponentially-decaying reverberation tail signal, and a plurality of third inputs coupled to the delay module to receive the plurality of the reverberation tail echo signals, the panning module configured to combine the audio signal, the exponentially-decaying reverberation tail signal, and the plurality of the reverberation tail echo signals, the panning module producing, and having an output to transmit, a multi-channel signal as the composite signal based on the combination of the audio signal, the exponentially-decaying reverberation tail signal, and the plurality of the reverberation tail echo signals.

13. The system of claim 12 wherein one of the resonators is a tunnel.

14. The system of claim 12 wherein one of the resonators is a parking structure.

15. The system of claim 12 wherein one of the resonators is a valley.

16. The system of claim 12 wherein one of the resonators is a street with tall buildings.

17. The system of claim 12 wherein the simulated sound source is a motorcycle engine.

18. The system of claim 12 wherein the simulated sound source is a gunshot.

19. The system of claim 12 wherein the simulated sound source is a siren.

* * * * *